United States Patent [19]
Farnworth et al.

[11] Patent Number: 5,796,746
[45] Date of Patent: Aug. 18, 1998

[54] DEVICE AND METHOD FOR TESTING INTEGRATED CIRCUIT DICE IN AN INTEGRATED CIRCUIT MODULE

[75] Inventors: Warren M. Farnworth, Nampa; James M. Wark, Boise; Eric S. Nelson, Boise; Kevin G. Duesman, Boise, all of Id.

[73] Assignee: Micron Technology, Inc., Boise, Id.

[21] Appl. No.: 718,173

[22] Filed: Sep. 19, 1996

Related U.S. Application Data

[63] Continuation-in-part of Ser. No. 577,840, Dec. 22, 1995, and Ser. No. 666,247, Jun. 20, 1996.

[51] Int. Cl.⁶ ............................................. G06F 11/00
[52] U.S. Cl. ............................................. 371/21.1
[58] Field of Search .......................... 371/21.1, 22.1, 371/22.2, 22.5, 22.6, 27.1, 28; 395/183.06

[56] References Cited

U.S. PATENT DOCUMENTS

| | | |
|---|---|---|
| 4,451,489 | 5/1984 | Leedy . |
| 4,459,685 | 7/1984 | Sud et al. . |
| 4,459,693 | 7/1984 | Prang et al. . |
| 4,491,857 | 1/1985 | McElroy . |
| 4,519,078 | 5/1985 | Komonytsky . |
| 4,543,594 | 9/1985 | Mohsen et al. . |
| 4,598,388 | 7/1986 | Anderson . |
| 4,601,019 | 7/1986 | Shah et al. . |
| 4,752,118 | 6/1988 | Johnson . |
| 4,817,093 | 3/1989 | Jacobs et al. . |
| 4,881,114 | 11/1989 | Mohsen et al. . |
| 4,937,465 | 6/1990 | Johnson et al. . |
| 4,939,694 | 7/1990 | Eaton et al. . |
| 5,089,993 | 2/1992 | Neal et al. . |
| 5,110,754 | 5/1992 | Lowrey et al. . |
| 5,157,664 | 10/1992 | Waite . |
| 5,241,496 | 8/1993 | Lowrey et al. . |
| 5,257,229 | 10/1993 | McClure et al. . |
| 5,278,839 | 1/1994 | Matsumoto et al. . |
| 5,305,267 | 4/1994 | Haraguchi et al. . |
| 5,324,681 | 6/1994 | Lowrey et al. . |
| 5,331,196 | 7/1994 | Lowrey et al. . |
| 5,355,340 | 10/1994 | Coker et al. . |
| 5,422,850 | 6/1995 | Sukegawa et al. . |
| 5,451,489 | 9/1995 | Leedy . |
| 5,506,499 | 4/1996 | Puar . |

FOREIGN PATENT DOCUMENTS

| | | |
|---|---|---|
| 0218851 A | 4/1987 | European Pat. Off. . |
| 0584739 A | 3/1994 | European Pat. Off. . |

*Primary Examiner*—V. Canney
*Attorney, Agent, or Firm*—Trask, Britt & Rossa

[57] ABSTRACT

An IC module, such as a Multi-Chip Module (MCM), includes multiple IC dice each having a test mode enable bond pad, such as an output enable pad. A fuse incorporated into the MCM's substrate connects each die's test mode enable pad to one of the MCM's no-connection (N/C) pins, and a resistor incorporated into the substrate connects the test mode enable pads to one of the MCM's reference voltage pins. By applying a supply voltage to the test mode enable pads through the N/C pin, a test mode is initiated in the dice. Once testing is complete, the fuse may be blown, and a reference voltage applied to the test mode enable pads through the reference voltage pins and the resistor disables the test mode in the dice and initiates an operational mode. As a result, dice packaged in IC modules may be tested after packaging. A method for performing such testing once the test mode has been initiated and for repairing any failing elements found during testing, includes providing test signals to the dice, receiving response signals from the dice, evaluating the response signals to identify any failing elements in the dice, programming the failing elements addresses into anti-fuses in the dice with a programming voltage, confirming that the addresses are programmed by determining the resistance of the anti-fuses, re-testing the dice, receiving response signals from the re-tested dice, and evaluating the response signals to confirm all repairs.

109 Claims, 14 Drawing Sheets

DEVICE AND METHOD FOR TESTING INTEGRATED CIRCUIT DICE IN AN INTEGRATED CIRCUIT MODULE

CROSS REFERENCE TO RELATED APPLICATIONS

This application is a continuation-in-part of pending applications entitled "Circuit and Method for Enabling a Function in a Multiple Memory Device Module," Ser. No. 08/577,840, filed Dec. 22, 1995, and "Method and Apparatus for Back-End Repair of Multi-Chip Modules," Ser. No. 08/666,247, filed Jun. 20, 1996.

BACKGROUND

1. Field of the Invention

This invention relates in general to integrated circuit (IC) dice, and in particular to devices and methods for testing dice in IC modules.

2. State of the Art

Integrated circuit (IC) dice are typically tested before they are packaged to determine if they have any failing circuitry. In general, one of the first steps in testing a die is to initiate a test mode in the die by applying control signals to selected bond pads on the die referred to as test bond pads. As an example, most Dynamic Random Access Memory (DRAM) dice manufactured by the Assignee of the present invention, Micron Technology, Inc. of Boise, Id., are tested in a test mode initiated, in part, by applying a logic "0" signal to their Output Enable (OE) bond pad.

As shown in FIG. 1, when multiple dice 10 are packaged together in an IC module 12, their test bond pads 14 (e.g., their OE bond pads) are often interconnected with their reference voltage bond pads 16 to the reference voltage $V_{SS}$ through module terminals 18 to ensure that a test mode cannot be accidentally initiated in an end user's system. While this works well to prevent accidental initiation of a test mode in dice in an IC module in the field, unfortunately it also prevents intentional testing of the dice by an IC manufacturer after they are packaged in the IC module.

One conventional solution to this problem, described in U.S. Pat. Nos. 5,278,839 and 4,519,078, is to eliminate the need to initiate a test mode in the manner described above by incorporating self test circuitry into dice. Because the self test circuitry is controlled through address and control bond pads that generally are not fixed to the reference voltage $V_{SS}$ or supply voltage $V_{CC}$, a test mode can be initiated with the self test circuitry after the dice are packaged in an IC module. However, self test circuitry is a cumbersome and expensive solution that does not address the need for a solution that is easily incorporated into existing dice and IC modules.

Because it would be advantageous to have the flexibility to test dice after they are packaged in an IC module, there is a need in the art for an improved device and method for initiating and performing such testing.

SUMMARY OF THE INVENTION

An inventive integrated circuit (IC) module, such as a Multi-Chip Module (MCM), includes a terminal receiving a test mode initiate signal, such as a supply voltage $V_{CC}$, and an IC die having a bond pad and a function circuit. A switching apparatus, such as a fuse, is connected with the bond pad between the terminal and the function circuit to conduct the test mode initiate signal to the function circuit, and an impedance apparatus, such as a resistor, connected between the function circuit and an operational mode signal, such as a reference voltage $V_{SS}$, supports a difference in voltages between the test mode initiate signal at the function circuit and the operation mode signal. The function circuit responds to the test mode initiate signal by initiating a test mode in the die. The switching circuit also selectively isolates the function circuit from the die, and the impedance apparatus then conducts the operational mode signal to the function circuit. The function circuit responds to the operational mode signal by entering an operational mode. Thus, a test mode can be initiated in the die after it is packaged in the IC module by providing the test mode initiate signal at the terminal, and the test mode can then be disabled and the die fixed in the operational mode by selectively isolating the function circuit from the terminal with the switching apparatus, thereby ensuring that the test mode is not accidentally initiated by an end user in the field.

In one version of this inventive IC module, the switching apparatus and the impedance apparatus are both incorporated in the die, and in other versions one or both of the switching apparatus and impedance apparatus are incorporated in a substrate of the IC module. In another version, the IC module itself is incorporated into an electronic system, such as a computer system. In still other versions, the operational mode signal is provided by an operational mode signal circuit on the die, or is provided by external circuitry through another terminal in the IC module. Finally, in a modified version of this inventive IC module, the test mode initiate signal is generated on the die by a test mode initiate signal circuit responsive to external circuitry rather than being provided by external circuitry.

In another embodiment of the present invention, an IC module includes one or more terminals receiving a test mode initiate signal and an operational mode signal. One or more IC dice in the IC module each have one or more function circuits and a plurality of bond pads, and a first subset of the bond pads is coupled to the function circuits while a second subset of the bond pads is adapted to receive signals other than the test mode initiate signal in the test mode. A dedicated conduction circuit coupled between the terminals and the first subset bond pads and isolated from the second subset bond pads conducts the test mode initiate and operational mode signals to the function circuits. When the function circuits receive the test mode initiate signal they initiate a test mode, and when the function circuits receive the operational mode signal they enter an operational mode. Thus, a test mode can be initiated in the dice after they are packaged in the IC module by providing the test mode initiate signal at the terminals, and an operational mode can be initiated by providing the operational mode signal at the terminals. In one version of this IC module, the IC module is incorporated into an electronic system. In other versions, the terminals comprise a first terminal receiving the test mode initiate signal and a second terminal receiving the operational mode signal, and the first and second terminals are coupled by an impedance element, such as a resistor, or by a link, such as a surface mount resistor or a jumper.

In still another embodiment, a test apparatus for testing dice provided in one of the inventive IC modules described above includes a test-apparatus-to-module interface coupleable to terminals of the IC module. A test mode initiate circuit initiates a test mode in the dice by providing the test mode initiate signal through the interface, and a test signal circuit for testing the dice in the test mode provides test signals to the dice through the interface. A response signal circuit receives response signals through the interface from the dice in response to the test signals, and an evaluator circuit evaluates the response signals to identify any failing elements in the dice. In an alternative to this embodiment, the functionality of the embodiment is incorporated into a computer test device including a test-device-to-module interface, an input/output device coupled to the interface for receiving signals from and outputting signals to the dice, a memory device, and a processor.

In a further embodiment of the present invention, a method for initiating a test mode and an operational mode in dice in an IC module includes: receiving a test mode initiate signal at a terminal of the IC module; conducting the test mode initiate signal only to those bond pads on dice in the IC module adapted to receive the signal and from those bond pads to function circuits in the dice to initiate a test mode therein; discontinuing conduction of the test mode initiate signal to the function circuits; and conducting an operational mode initiate signal to each function circuit to initiate the operational mode therein.

In a still further embodiment, a method for testing one or more dice in an IC module includes: providing a test mode initiate signal to an externally accessible terminal of the IC module; conducting the test mode initiate signal exclusively to bond pads on the dice adapted to receive the signal to initiate a test mode in the dice; testing each die; receiving response signals from the dice; and evaluating the response signals to identify any failing elements in the dice.

In one version of this embodiment, the method also includes: determining an address associated with each failing element; latching the failing element's address into the dice; providing a programming mode enable signal, such as a super voltage CAS signal, to the dice to enable a programming mode therein; enabling a redundant element in one of the dice to replace a failing element; and programming a redundancy circuit associated with the enabled redundant element to store the failing element's address so that the stored address directs the redundancy circuit to replace the failing element with the enabled redundant element.

Another embodiment of the present invention is a computer readable storage medium upon which is stored a program for controlling a computer to perform in accordance with the method described above for testing one or more dice in an IC module.

DESCRIPTION OF THE PREFERRED EMBODIMENTS

Figure 1:
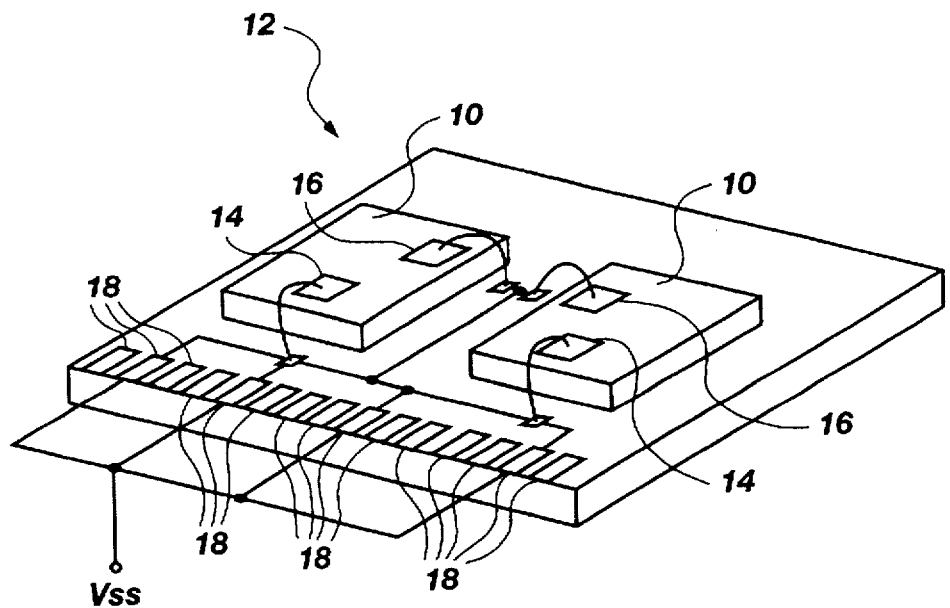
FIG. 1 is an isometric view of a prior art integrated circuit module.
Figure 2:
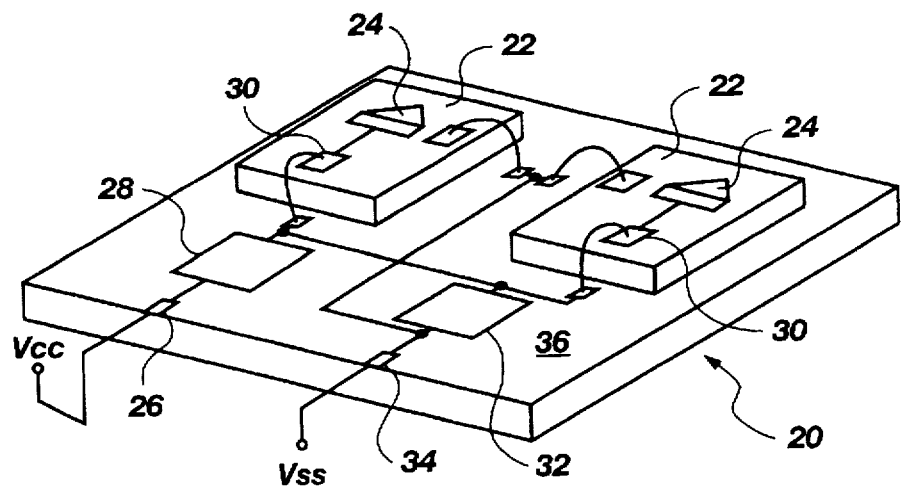
FIG. 2 is an isometric, block and schematic view of an integrated circuit module including a switching circuit and an impedance circuit in accordance with the present invention.

As shown in FIG. 2, an inventive integrated circuit (IC) module 20 includes IC dice 22 having function circuits, such as input buffers 24, selectively receiving a test mode initiate signal, such as a supply voltage $V_{cc}$, through a module terminal 26, a switching circuit 28, and test mode enable bond pads 30 (e.g., Output Enable (OE) bond pads). It will be understood by those having skill in the field of this invention that the IC module 20 may be any electronic structure having at least one die accessed externally through terminals, including, for example, any Multi-Chip Module (MCM), such as a Single In-line Memory Module (SIMM), a Dual In-line Memory Module (DIMM), a Random Access Memory (RAM) card, a flash Read-Only-Memory (ROM) module or card, a Synchronous Dynamic RAM (SDRAM) module or card, and a Rambus RAM module or card. It will also be understood that the dice 22 may be any dice for purposes of the present invention, including, for example, DRAM dice, Static Random Access Memory (SRAM) dice, Synchronous Graphics Random Access Memory (SGRAM) dice, ROM dice, and processor dice.

Also, it will be understood that the function circuits may be any circuitry on a die for initiating a test mode in the die, the test mode initiate signal may be any signal for initiating a test mode in a die, the module terminal 26 may be any terminal including, for example, a MCM pin (e.g., a SIMM, DIMM, RAM card, RAM module, ROM card, or ROM module pin), the switching circuit 28 may be, for example, a fuse or a transistor or any other device for selectively isolating the function circuits from the module terminal 26, and the test mode enable bond pads 30 may be any bond pads connectable to a function circuit for enabling a test mode in a die. Further, it should be understood that although the switching circuit 28 is shown in FIG. 2 as being a single circuit coupled to the module terminal 26, it may instead comprise a plurality of circuits, each one coupled to the module terminal 26 and one of the dice 22.

In response to receiving the test mode initiate signal, the input buffers 24 initiate a test mode in the dice 22. In this mode, various test signals may be provided to the dice 22 in a well known manner to test the circuitry thereon, and the dice 22 then output various response signals indicating the presence of any failing circuitry. While the test mode initiate signal, such as the supply voltage $V_{CC}$, is being provided to the test mode enable bond pads 30 and the input buffers 24, an impedance circuit 32, such as, for example, a resistor, resistance-connected MOS transistor, or anti-fuse, supports a difference in voltages between the test mode initiate signal at the test mode enable bond pads 30 and an operational mode enable signal, such as a reference voltage $V_{SS}$, at a reference terminal 34, such as, for example, a MCM pin (e.g., a SIMM, DIMM, RAM card, RAM module, ROM card, or ROM module pin). It will be understood that although the impedance circuit 32 is shown in FIG. 2 as being a single circuit coupled to the reference terminal 34, it may instead comprise a plurality of circuits, each one coupled to the reference terminal 34 and one of the dice 22.

Once testing of the dice 22 is complete, the switching circuit 28 isolates the input buffers 24 from the module terminal 26 to disable the test mode, and the impedance circuit 34 conducts the operational mode signal, such as the reference voltage $V_{SS}$, to the input buffers 24. In response, the input buffers 24 initiate an operational mode in the dice 22 in which the dice 22 operate in accordance with their intended normal function. Thus, for example, if the dice 22 are DRAM's, they would perform normal memory operations in their operational mode.

Thus, the dice 22 in the IC module 20 are fully testable even after being packaged, and yet their test mode can be disabled as necessary so the IC module 20 can be used by end users in the field.

As will be described in more detail below with respect to FIGS. 6 and 9, one or both of the switching circuit 28 and the impedance circuit 32 may be incorporated into the dice 22 instead of being provided on a substrate 36 of the IC module 20 as shown in FIG. 2. Also, as will be described in more detail below with respect to FIG. 9, one or both of the test mode initiate signal and the operational mode signal may be generated on the dice 22 rather than being provided by external circuitry.

Figure 3A:
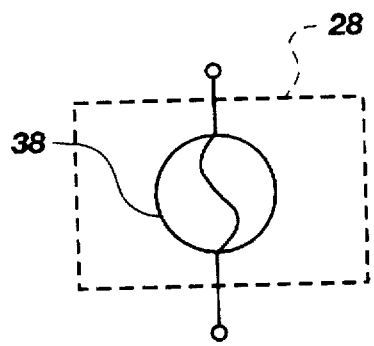
FIGS. 3A–C are schematic views of alternative versions of the switching circuit of FIG. 2.
Figure 3B:
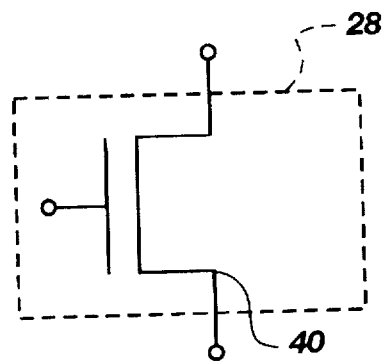
Figure 3C:
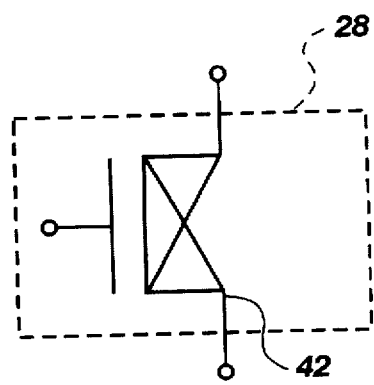
Figure 4A:
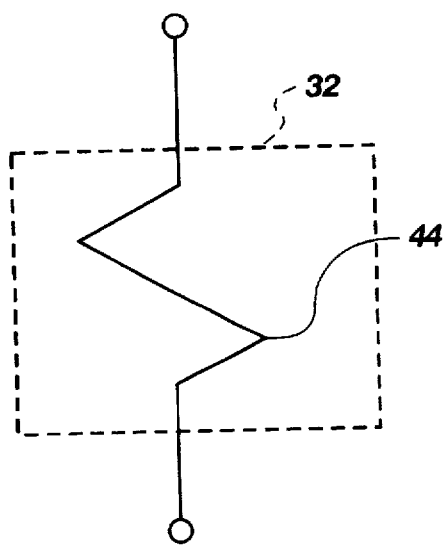
FIGS. 4A–C are schematic views of alternative versions of the impedance circuit of FIG. 2.
Figure 4B:
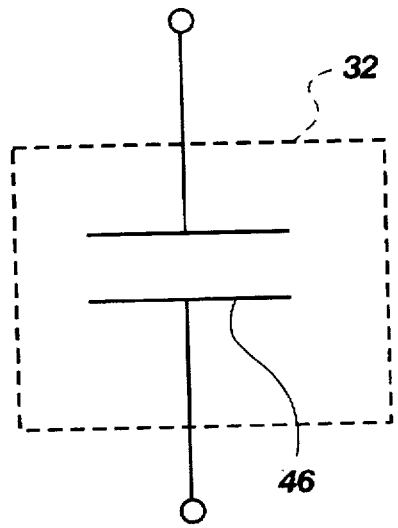
Figure 4C:
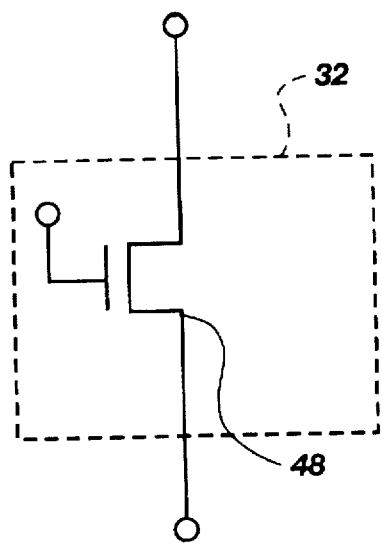
Figure 5:
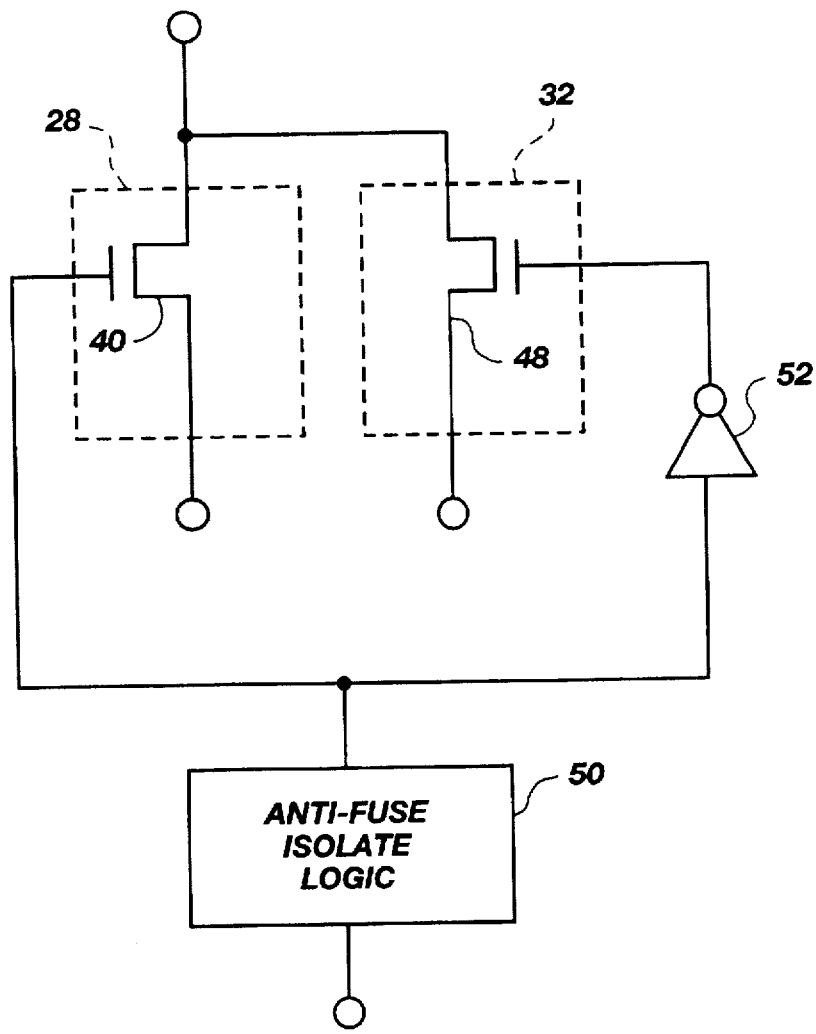
FIG. 5 is a schematic and block view of an alternative version of the switching and impedance circuits of FIG. 2.

As shown in FIGS. 3A, 3B, and 3C, the switching circuit 28 of FIG. 2 can be, for example, a fuse 38 that is blown once testing is complete, or an NMOS transistor 40 or PMOS transistor 42 that is de-activated once testing is complete. Also, as shown in FIGS. 4A, 4B and 4C, the impedance circuit 32 of FIG. 2 can be, for example, a resistor 44, an anti-fuse 46 that is blown once testing is complete, or an NMOS transistor 48 that is activated once testing is complete. Further, as shown in FIG. 5, the NMOS transistor 40 of FIG. 3B and the NMOS transistor 48 of FIG. 4C, for example, may be controlled by an anti-fuse isolate logic circuit 50 that outputs a high voltage during a test mode and is then programmed to output a low voltage once testing is complete. The high voltage during the test mode activates the NMOS transistor 40 and de-activates the NMOS transistor 48 through an inverter 52, and the low voltage after programming de-activates the NMOS transistor 40 and activates the NMOS transistor 48 through the inverter 52. Of course, a wide variety of other combinations are well within the scope of the present invention.

Figure 6:
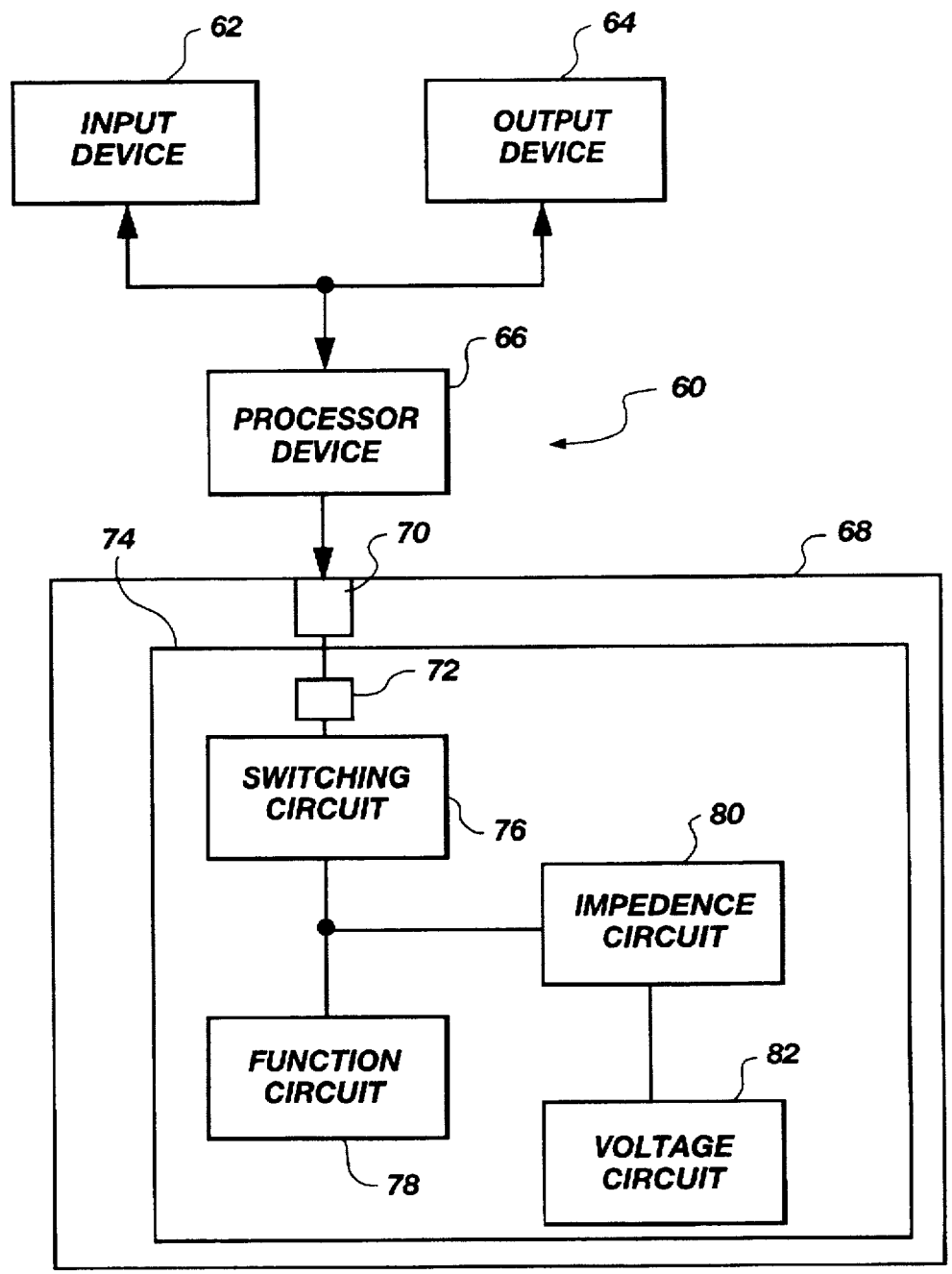
FIG. 6 is a block diagram of an electronic system in accordance with the present invention.

As shown in FIG. 6, in another embodiment the present invention comprises an electronic system 60, such as a computer system, including an input device 62, an output device 64, a processor device 66, such as a state machine, and a memory device, such as an IC module 68. Although this embodiment will be described with respect to the memory device comprising the IC module 68, it will be understood that the IC module 68 could comprise all or any portion of the input device 62, the output device 64, the processor device 66, and the memory device. Also, although the electronic system 60 will be described with respect to a particular IC module 68, it will be understood that the present invention includes any of the inventive IC modules described herein as incorporated into an electronic system. Further, as discussed above, it will be understood that the IC module 68 may comprise any electronic structure having at least one die externally accessible through terminals, including, for example, a MCM, such as a SIMM, DIMM, RAM card, RAM module, ROM card, or ROM module.

The IC module 68 includes a terminal 70, such as a MCM pin as discussed above, receiving a test mode initiate signal (e.g., the supply voltage $V_{CC}$) from the processor device 66. The terminal 70 conducts the test mode initiate signal to a bond pad 72 of an IC die 74. As discussed above, it will be understood that the IC die 74 may be any die, including, for example, a DRAM die, SRAM die, SGRAM die, processor die, flash ROM die, SDRAM die, or Rambus RAM die.

To initiate a test mode in the die 74, a switching circuit 76 conducts the test mode initiate signal from the bond pad 72 to a function circuit 78 (e.g., an OE input buffer). In response, the function circuit 78 initiates a test mode in the die 74 as described above. While the test mode initiate signal is being conducted to the function circuit 78, an impedance circuit 80 supports a difference in voltages between the test mode initiate signal at the function circuit 78 and an operational mode signal, such as a reference voltage $V_{SS}$, supplied by an operational mode voltage circuit 82.

It should be understood that the switching circuit 76 may, for example, comprise a fuse or a MOS transistor, the function circuit 78 may comprise any circuit which enables or initiates a test mode in response to a test mode initiate signal, the impedance circuit 80 may, for example, comprise an anti-fuse, a MOS transistor, or a resistor, and the operational mode voltage circuit 82 may comprise any circuit for supplying an operational mode signal, such as a reference voltage $V_{SS}$, on a die.

When testing is over, the switching circuit 76 isolates the function circuit 78 from the bond pad 72 to disable the test mode in the die 74 by, for example, blowing a fuse or de-activating a MOS transistor. The impedance circuit 80 then conducts the operational mode signal from the operational mode voltage circuit 82 to the function circuit 78 by, for example, blowing an anti-fuse or activating a MOS transistor. In response to the operational mode signal, the function circuit 78 initiates an operational mode in the die 74 as described above.

Thus, the die 74 is fully testable even after being packaged in the IC module 68, and yet the test mode of the die 74 can be disabled as necessary so the IC module 68 can be used by end users in the field.

Figure 7:
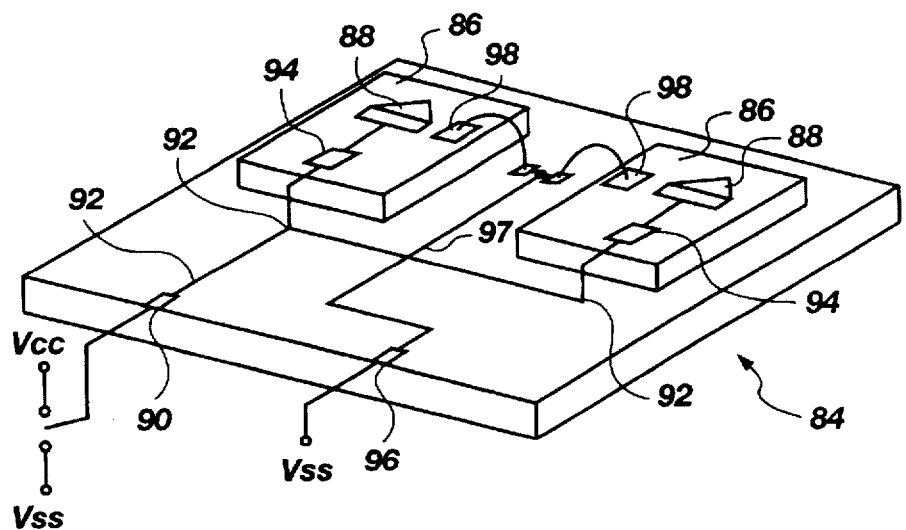
FIG. 7 is an isometric and schematic view of another integrated circuit module in accordance with the present invention.

As shown in FIG. 7, an inventive IC module 84 includes dice 86 having function circuits, such as input buffers 88, selectively receiving a test mode initiate signal, such as a supply voltage $V_{cc}$, through a first terminal 90, a dedicated conductor 92, and test mode enable bond pads 94 (e.g., Output Enable (OE) bond pads). It will be understood by those having skill in the field of this invention that the IC module 84 may be any electronic structure having at least one die accessed externally through terminals, including, for example, a MCM, such as a SIMM, a DIMM, a RAM card, a RAM module, a ROM card, and a ROM module. It will also be understood that the dice 86 may be any dice for purposes of the present invention, including, for example, DRAM dice, SRAM dice, SGRAM dice, flash ROM dice, SDRAM dice, Rambus RAM dice, and processor dice.

Also, it will be understood that the function circuits may be any circuitry on a die for initiating a test mode in the die, the test mode initiate signal may be any signal for initiating a test mode in a die, the first terminal 90 may be any terminal including, for example, a MCM pin, such as a SIMM, DIMM, RAM card, ROM card, RAM module, or ROM module pin, the dedicated conductor 92 may be, for example, any conductive structure or device connected exclusively to those bond pads 94 on the dice 86 adapted to receive the test mode initiate signal or unaffected by receipt of the test mode initiate signal, and the test mode enable bond pads 94 may be any bond pads connectable to a function circuit for enabling a test mode in a die.

In response to receiving the test mode initiate signal, the input buffers 88 initiate a test mode in the dice 86 in a well known manner as described above. Once testing of the dice 86 is complete, an operational mode signal, such as a reference voltage $V_{SS}$, is provided through the first terminal 90 and the dedicated conductor 92 to the input buffers 88 to initiate an operational mode in the dice 86 in the well known manner described above. A second terminal 96 provides the reference voltage $V_{SS}$ to other circuits in the dice 86 via a reference conductor 97 and reference voltage bond pads 98.

Thus, the dice 86 in the IC module 84 are fully testable even after being packaged, and yet the operational mode can be enabled as necessary so the IC module 86 can be used by end users in the field.

Figure 8A:
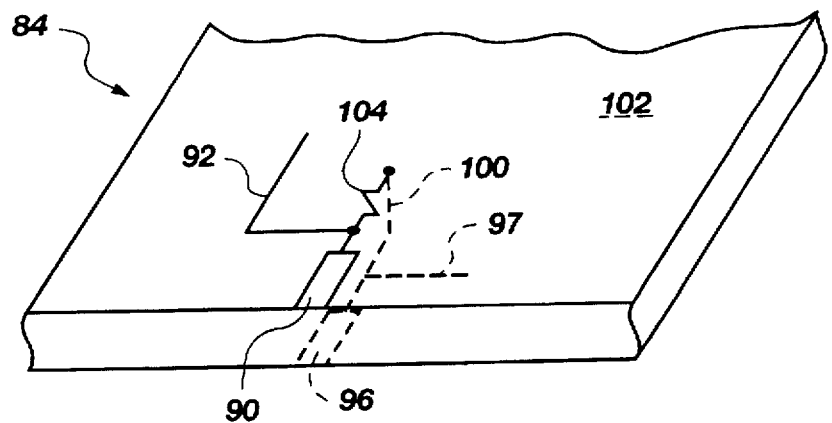
FIGS. 8A and 8B are isometric and schematic views of alternative versions of the integrated circuit module of FIG. 7.

As shown in FIG. 8A in an isometric view of a portion of an alternative version of the IC module 84 of FIG. 7, a conductive via 100 through a substrate 102 of the IC module 84 couples the first terminal 90 and dedicated conductor 92 to the second terminal 96 and the reference conductor 97 through an impedance element, such as a surface mount resistor 104. Of course, the impedance element may, for example, comprise a resistance-connected MOS transistor rather than the surface mount resistor 104.

During testing, a test mode initiate signal, such as the supply voltage $V_{CC}$, may be supplied to the first terminal 90 to initiate a test mode as described above with respect to FIG. 7. At the same time, an operational mode signal, such as the reference voltage $V_{SS}$, may be supplied to the second terminal 96 without interfering with the test mode, because the surface mount resistor 104 supports a difference in voltages between the test mode initiate signal at the first terminal 90 and the operational mode signal at the second terminal 96.

Once testing is complete, the operational mode signal, or no signal, may be supplied to the first terminal 90. At the same time, the surface mount resistor 104 conducts the operational mode signal from the second terminal 96 to the dedicated conductor 92, in order to initiate the operational mode as described above with respect to FIG. 7.

Figure 8B:
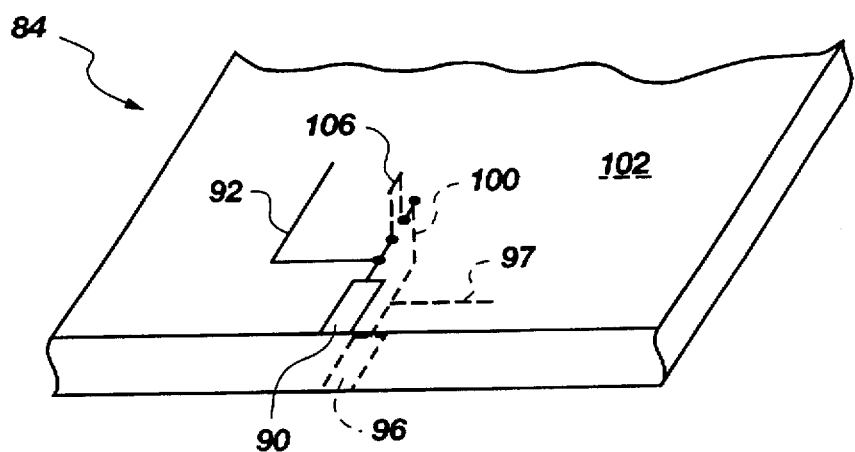

As shown in FIG. 8B in an isometric view of a portion of another alternative version of the IC module 84 of FIG. 7, a test mode initiate signal, such as the supply voltage $V_{cc}$, may be supplied to the first terminal 90 during testing to initiate a test mode as described above with respect to FIG. 7. At the same time, an operational mode signal, such as the reference voltage $V_{ss}$, may be supplied to the second terminal 96 and the reference conductor 97 without interfering with the test mode, because a removable link 106, such as a jumper or Ø Ohm surface mount resistor, is not present during testing, thus isolating the second terminal 96 from the first terminal 90.

Once testing is complete, the operational mode signal, or no signal, may be supplied to the first terminal 90. At the same time, the link 106 is positioned to connect the second terminal to the dedicated conductor 92 through the conductive via 100 in the substrate 102, thereby conducting the operational mode signal from the second terminal 96 to the dedicated conductor 92 in order to initiate the operational mode as described above with respect to FIG. 7.

Although the first and second terminals 90 and 96 are shown in FIGS. 8A and 8B as being on opposing sides of the substrate 102, it will be understood that the invention is not so limited.

Figure 9:
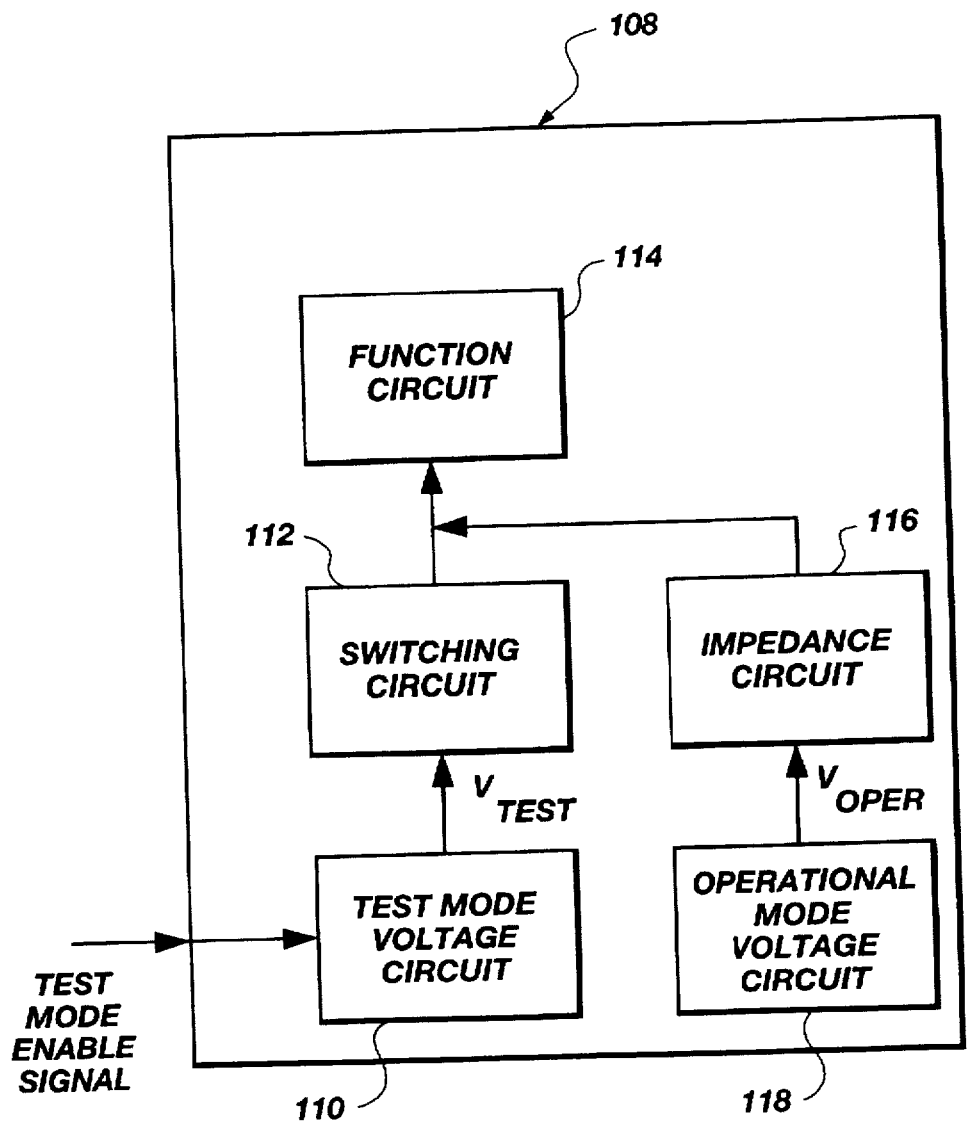
FIG. 9 is a block diagram of an integrated circuit die in accordance with the present invention.

As shown in FIG. 9, in another embodiment the present invention comprises an IC die 108. As discussed above, the IC die 108 may be any die including, for example, a DRAM die, SRAM die, SGRAM die, flash ROM die, SDRAM die, Rambus RAM die, or processor die. To initiate a test mode in the die 108, a test mode enable signal directs a test mode voltage circuit 110 in the die 108 to generate a test mode voltage $V_{TEST}$, such as 3.3 Volts. A switching circuit 112 then conducts the test mode voltage $V_{TEST}$ to a function circuit 114 (e.g., an OE input buffer). In response, the function circuit 114 initiates a test mode in the die 108 as described above. While the test mode voltage $V_{TEST}$ is being conducted to the function circuit 114, an impedance circuit 116 supports a difference in voltages between the test mode voltage $V_{TEST}$ at the function circuit 114 and an operational mode voltage $V_{OPER}$, such as 0.0 Volts, supplied by an operational mode voltage circuit 118.

It should be understood that the switching circuit 112 may, for example, comprise a fuse or a MOS transistor, the function circuit 114 may comprise any circuit which enables or initiates a test mode in response to a test mode voltage $V_{TEST}$, the impedance circuit 116 may, for example, comprise an anti-fuse, a MOS transistor, or a resistor, and the operational mode voltage circuit 118 may comprise any circuit for supplying an operational mode voltage $V_{OPER}$ on a die.

When testing is over, the switching circuit 112 isolates the function circuit 114 from the test mode voltage $V_{TEST}$ to disable the test mode in the die 108 by, for example, blowing a fuse or de-activating a MOS transistor. The impedance circuit 116 then conducts the operational mode voltage $V_{OPER}$ from the operational mode voltage circuit 118 to the function circuit 114 by, for example, blowing an anti-fuse or activating a MOS transistor. In response to the operational mode voltage $V_{OPER}$, the function circuit 118 initiates an operational mode in the die 108 as described above.

Thus, the die 108 is fully testable even after being packaged, and yet the test mode of the die 108 can be disabled as necessary so the die 108 can be used by end users in the field.

Figure 10:
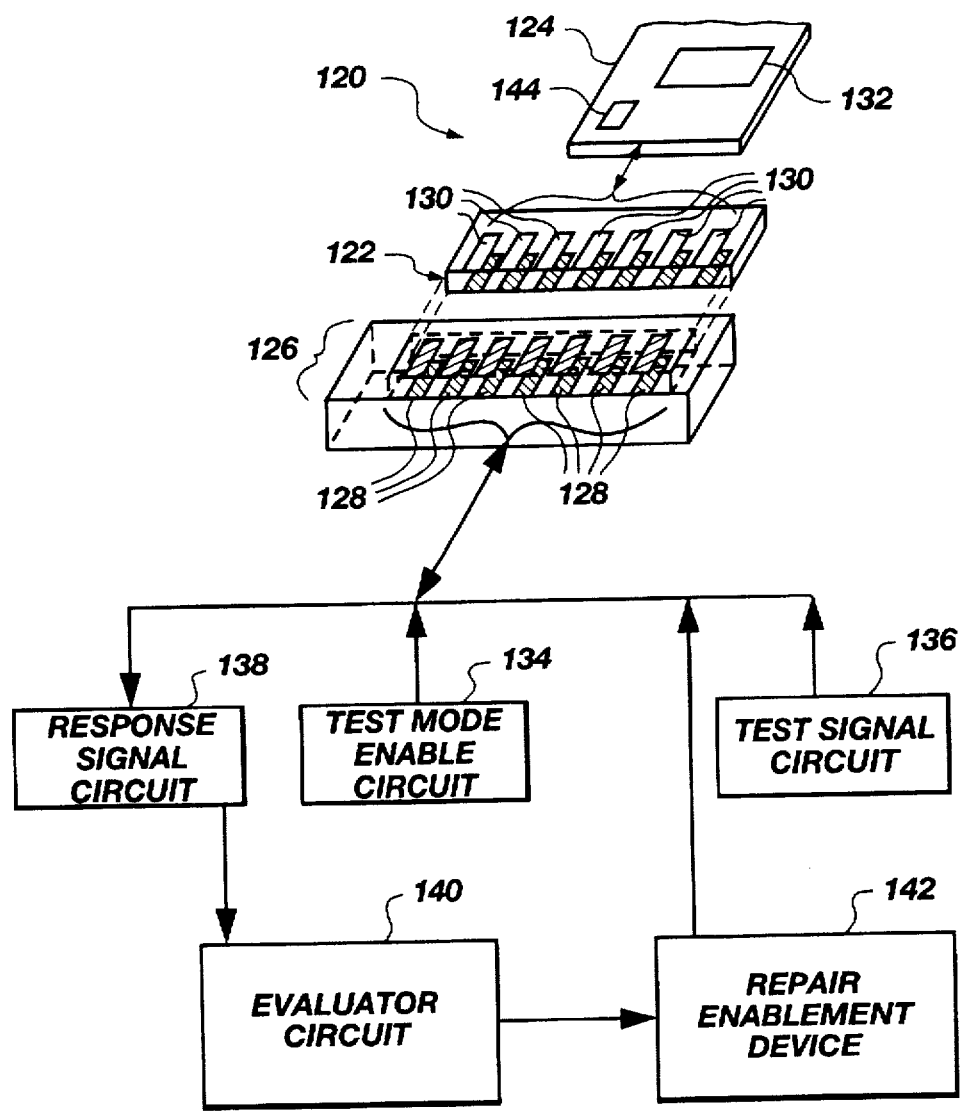
FIG. 10 is a block, schematic and isometric view of a test apparatus in accordance with the present invention.

As shown in FIG. 10, a test apparatus 120 for testing an IC module 122 of the present invention having an IC die 124 includes a test-apparatus-to-module interface 126 having interface terminals 128 connectable to module terminals 130 on the IC module 122. The module terminals 130, in turn, are in communication with the die 124 including a redundancy circuit 132. A test mode enable circuit 134 provides a test mode initiate signal to the die 124 through the interface 126 to initiate a test mode in the die 124 in the manner described above. A test signal circuit 136 then provides test signals to the die 124 through the interface 126 to test the die 124 in the test mode. A response signal circuit 138 receives response signals from the die 124 in the test mode in response to the test signals, and an evaluator circuit 140 then evaluates the response signals to identify any failing circuitry in the die 124.

A repair enablement device 142 in the test apparatus 120 may provide repair control signals to the redundancy circuit 132 in the die 124 directing the redundancy circuit 132 to replace any failing circuitry identified by the evaluator circuit 140 with redundant elements 144 in the die 124. The manner in which repair control signals may direct the redundancy circuit 132 to repair any failing circuitry in the die 124 is well known by those skilled in the art.

Figure 11:
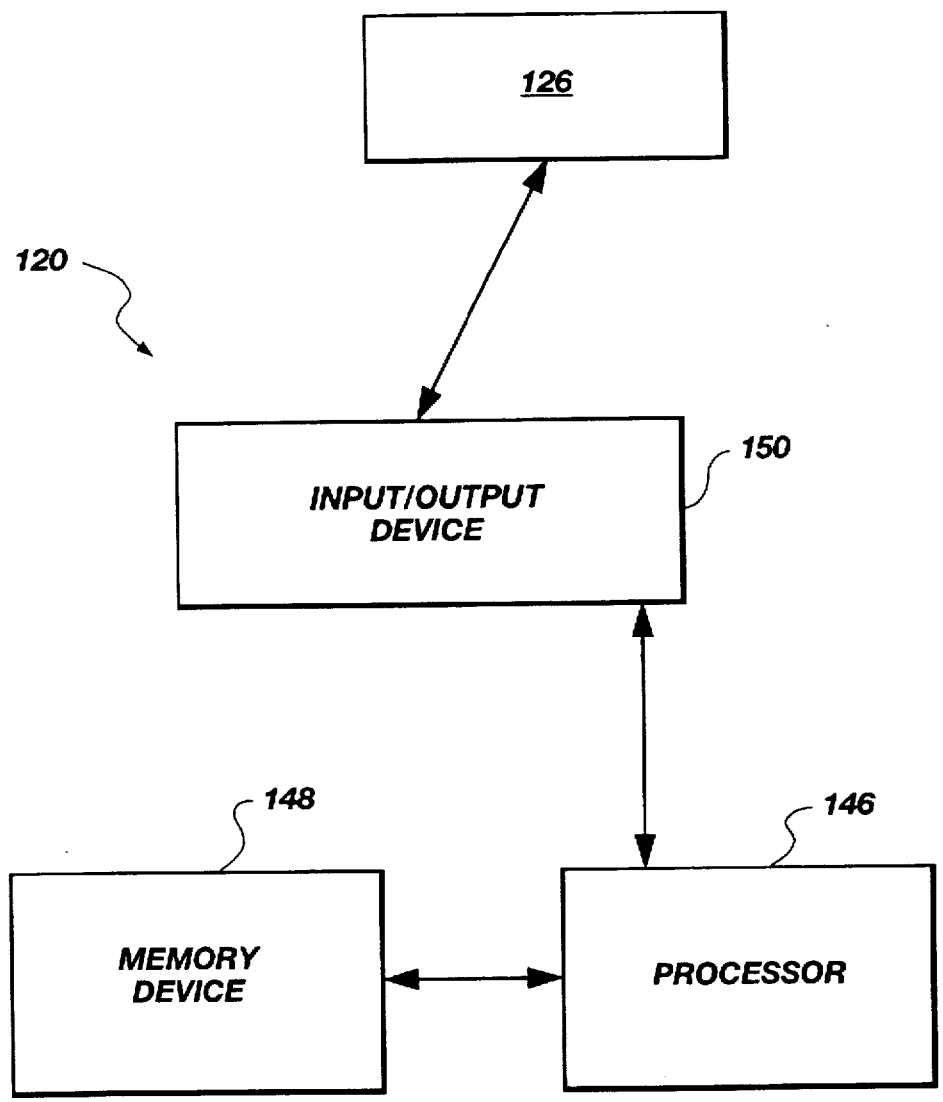
FIG. 11 is a block diagram of an alternative version of the test apparatus of FIG. 10.

As shown in FIG. 11 in a block diagram of an alternative version of the test apparatus 120 described with respect to FIG. 10, a processor 146 coupled to a memory device 148 and an input/output device 150 may provide the test mode initiate signal, the test signals, and the repair control signals, and may receive and evaluate the response signals, in the manner described above with respect to FIG. 10. It should be understood that the memory device 148 may comprise any permanent or temporary electronic storage medium, including, for example, a DRAM, SRAM, SGRAM, disk, tape, memory card, memory module, or programmable logic array.

Figure 12A:
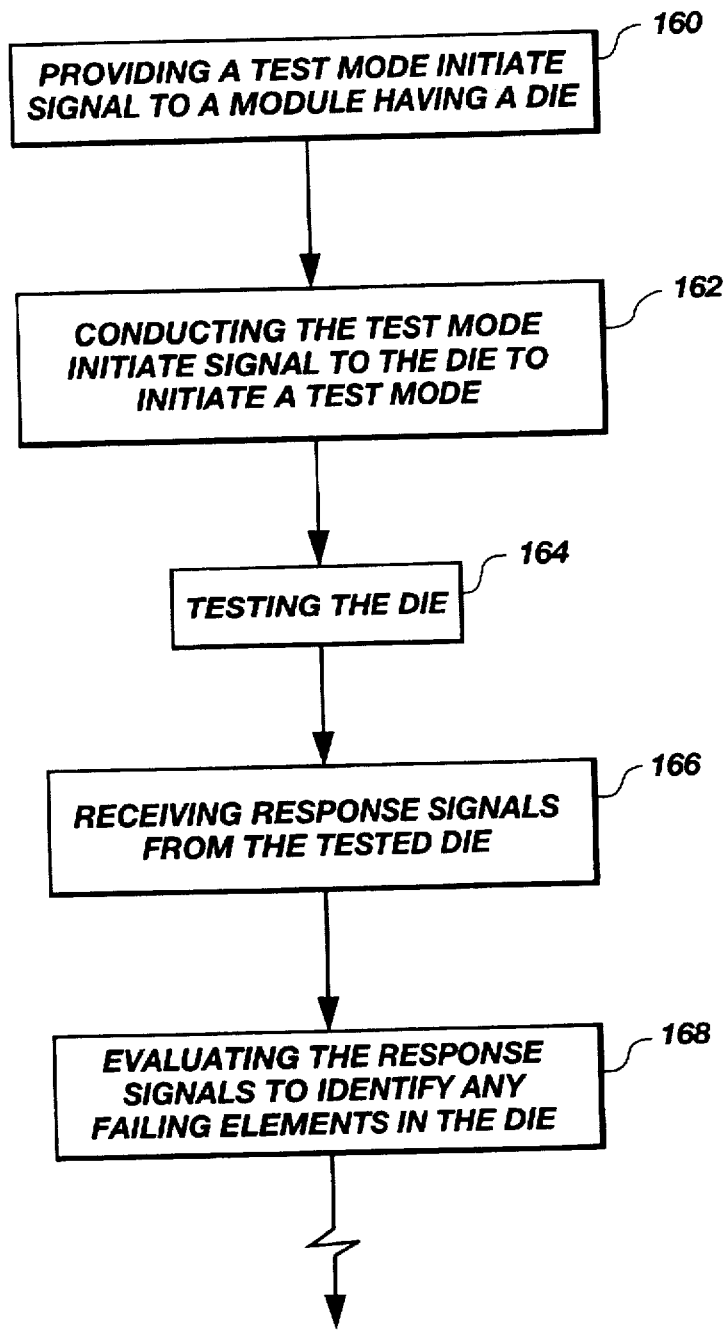
FIGS. 12A and 12B are flow diagrams of a method for testing integrated circuit dice in an integrated circuit module in accordance with the present invention.
Figure 12B:
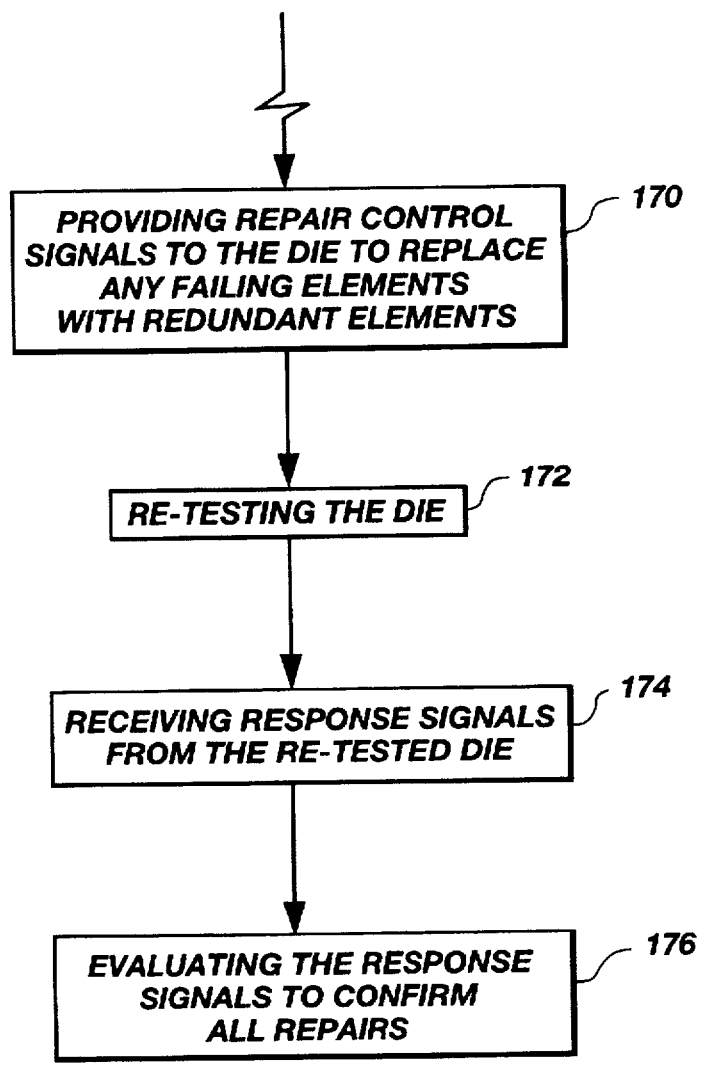

As shown in still another embodiment of the present invention in FIGS. 12A and 12B, a method for testing any one of the above-described inventive IC dice or modules includes the steps of: 160 providing a test mode initiate signal to an externally accessible terminal of an IC module; 162 conducting the test mode initiate signal exclusively to bond pads on dice in the IC module adapted to receive the signal to initiate a test mode in the dice; 164 testing each of the dice in the test mode by providing test signals to each die through the externally accessible terminals of the IC module; 166 receiving response signals from each die through the terminals of the IC module in response to the test signals; 168 evaluating the response signals from each die to identify any failing elements in the dice of the IC module; 170 providing repair control signals to a redundant circuit in each die to direct each die to replace any identified failing elements with redundant elements; 172 re-testing each die by providing re-test signals to each die through the IC module's externally accessible terminals; 174 receiving response signals from each die through the IC module's terminals in response to the re-test signals; and 176 evaluating the response signals from each die to confirm the repair of any failing elements therein.

Figure 13A:
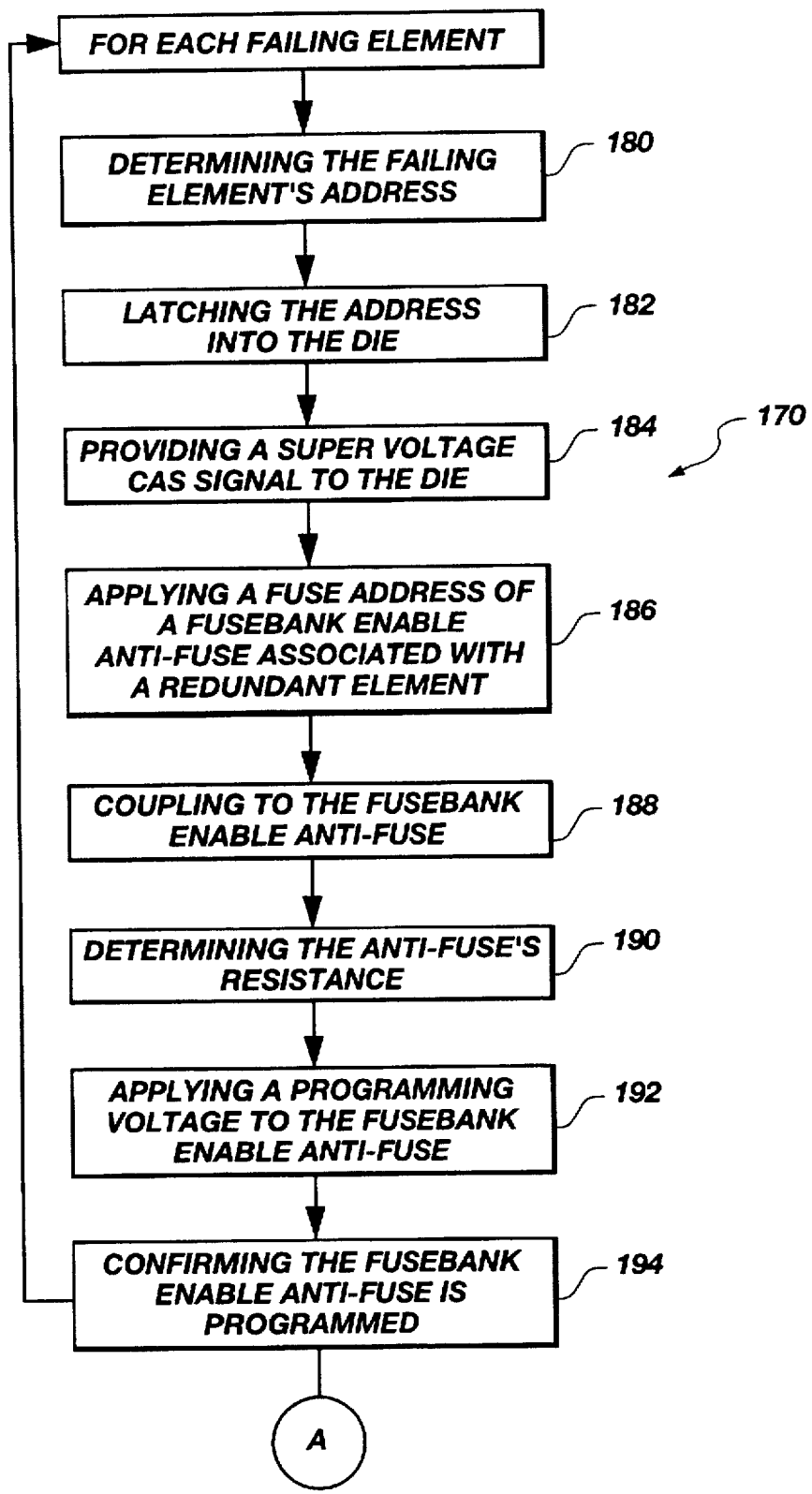
FIGS. 13A and 13B are flow diagrams showing the method of FIGS. 12A and 12B in more detail.
Figure 13B:
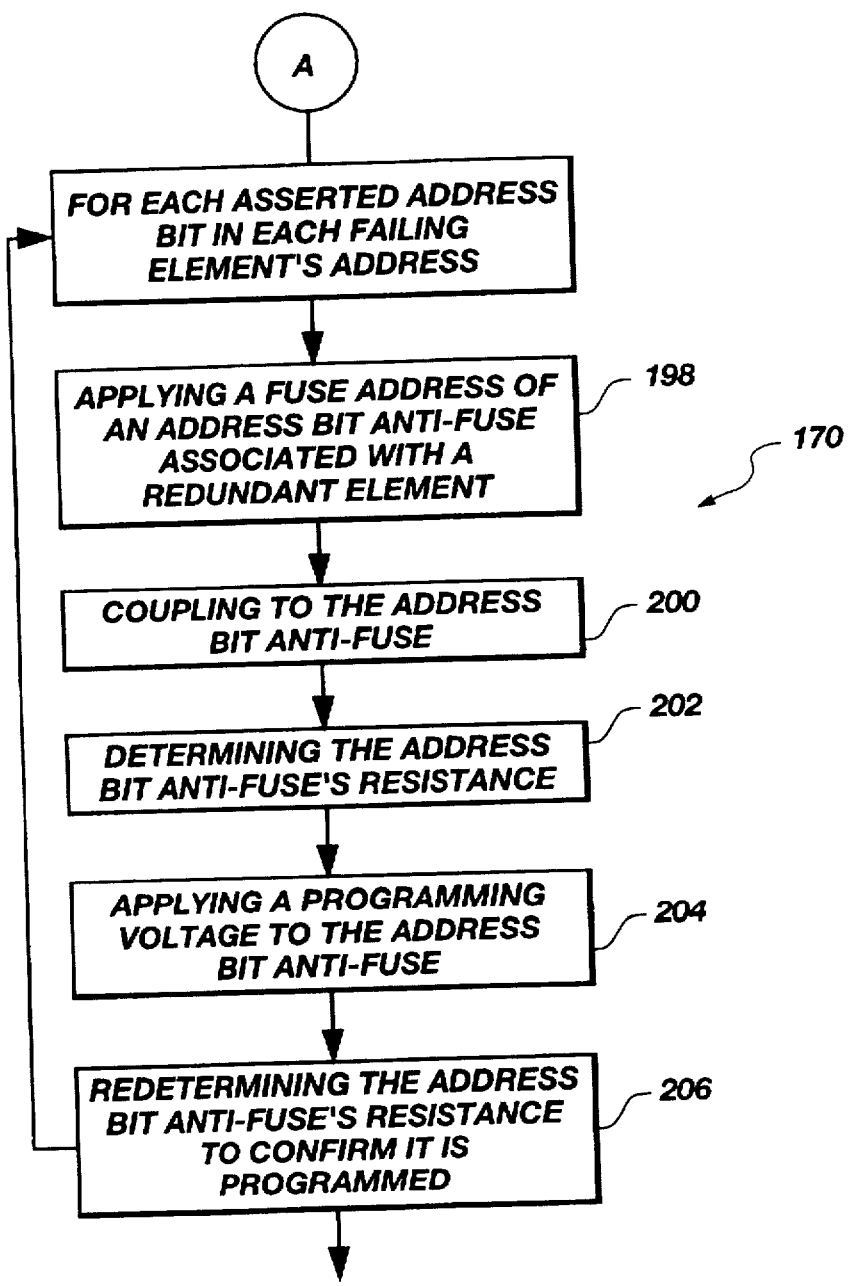

As shown in FIGS. 13A and 13B, the step 170 from FIGS. 12A and 12B of providing repair control signals to a redundant circuit in each die includes, for each identified failing element, the steps of: 180 determining an address associated with the failing element; 182 latching the failing element's address into the dice; 184 providing a programming mode enable signal, such as a super voltage Column Address Strobe (CAS) signal, to the dice to enable a programming mode therein; 186 applying a fuse address of a fusebank enable anti-fuse associated with a redundant element selected to replace the failing element to the IC module's terminals to identify the location of the anti-fuse; 188 coupling to the anti-fuse; 190 determining the anti-fuse's resistance; 192 applying a programming voltage, such as 8 to 10 Volts, to the anti-fuse to blow the anti-fuse; 194 re-determining the anti-fuse's resistance to confirm it is blown; and, for each asserted address bit in each failing element's address: 198 applying a fuse address of an address bit anti-fuse associated with the redundant element selected to replace the failing element to the IC module's terminals to identify the location of the anti-fuse; 200 coupling to the anti-fuse; 202 determining the address bit anti-fuse's resistance; 204 applying a programming voltage, such as 8 to 10 Volts, to the anti-fuse to blow the anti-fuse; and 206 re-determining the address bit anti-fuse's resistance to confirm it is programmed. As used herein, each "asserted" address bit in a failing element's address may be each "1" bit in the address or each "0" bit in the address.

It will be understood that any or all of the steps 160–206 in the embodiment of FIGS. 12A, 12B, 13A, and 13B, or any portion thereof, may be implemented in hardware, software, or both, using a wide variety of well-known architectures, including, for example, a state machine and the embodiment of FIGS. 10 and 11. It will also be understood that, although the embodiment of FIGS. 12A, 12B, 13A, and 13B has been described with respect to anti-fuses, any programmable circuit or element will work for purposes of the present invention. Also, it will be understood that the step 186 in FIG. 13A may include automatic selection of the location and type of redundant element (e.g., redundant row or column) to be used to replace the failing element. Finally, it will be understood that the steps 180 to 206 of FIGS. 13A and 13B may be automated by computer or performed manually.

The present invention thus advantageously provides a device and method for testing and repairing IC dice already packaged in IC modules.

Although the present invention has been described with reference to particular embodiments, the invention is not limited to these described embodiments. Rather, the invention is limited only by the appended claims, which include within their scope all equivalent devices or methods which operate according to the principles of the invention as described.

What is claimed is:

1. An apparatus for switching first and second voltages to a function circuit in an integrated circuit die having a bond pad, the die being provided in an integrated circuit module having a module terminal for receiving the first voltage from circuitry external to the module, the apparatus comprising:

a switching circuit connected with the bond pad between the module terminal and the function circuit for selectively isolating the function circuit from the module terminal and for otherwise conducting the first voltage to the function circuit; and an impedance circuit for conducting the second voltage to the function circuit when the function circuit is isolated from the module terminal and for otherwise supporting a voltage differential between the first voltage at the function circuit and the second voltage.

2. The apparatus of claim 1 wherein the first voltage is a supply voltage and the second voltage is a reference voltage.

3. The apparatus of claim 1 wherein the switching circuit comprises a programmable circuit for programmably isolating the function circuit.

4. The apparatus of claim 3 wherein the programmable circuit comprises a programmable element selected from a group comprising a metal fuse and a polysilicon fuse.

5. The apparatus of claim 4 wherein the programmable element is interposed between the bond pad and one of the function circuit and the module terminal.

6. The apparatus of claim 1 wherein the switching circuit comprises a switchable element selected from a group comprising an NMOS transistor and a PMOS transistor.

7. The apparatus of claim 1 wherein the switching circuit is disposed in the die and is connected between the bond pad and the function circuit.

8. The apparatus of claim 1 wherein the module includes a substrate to which the die is attached, wherein the switching circuit is disposed in the substrate and is connected between the module terminal and the bond pad.

9. The apparatus of claim 1 wherein the impedance circuit comprises a resistance circuit selected from a group comprising a resistor, a MOS transistor, and an anti-fuse.

10. The apparatus of claim 1 wherein the impedance circuit is disposed in the die and is connected to the bond pad and the function circuit.

11. The apparatus of claim 1 wherein the module includes a substrate to which the die is attached, wherein the impedance circuit is disposed in the substrate and is connected to the bond pad.

12. The apparatus of claim 1 wherein the module also has a voltage terminal for receiving the second voltage from circuitry external to the module, wherein the impedance circuit is connected between the voltage terminal and the bond pad.

13. The apparatus of claim 1 wherein the die includes a supply circuit for providing the second voltage, wherein the impedance circuit is coupled between the supply circuit and the function circuit.

14. An integrated circuit die comprising:

a die bond pad for receiving a test initiating signal from circuitry external to the die;

a function circuit responsive to the test initiating signal by entering a test mode and responsive to an operational signal by entering an operational mode;

a switching circuit connected between the die bond pad and the function circuit for selectively isolating the function circuit from the die bond pad and for otherwise conducting the test initiating signal to the function circuit; and an impedance circuit connected to the function circuit for conducting the operational signal to the function circuit when the function circuit is isolated from the die bond pad and for otherwise supporting a voltage differential between the test initiating signal at the function circuit and the operational signal.

15. The integrated circuit die of claim 14 wherein the die bond pad comprises an output enable die bond pad.

16. The integrated circuit die of claim 14 wherein the test initiating signal comprises a supply voltage.

17. The integrated circuit die of claim 14 wherein the function circuit includes an input buffer.

18. The integrated circuit die of claim 14 wherein the operational signal comprises a reference voltage.

19. The integrated circuit die of claim 14, further comprising a supply circuit coupled to the impedance circuit for providing the operational signal.

20. The integrated circuit die of claim 14, further comprising a signal bond pad for receiving the operational signal from circuitry external to the die, the signal bond pad being coupled to the impedance circuit for providing the operational signal thereto.

21. An integrated circuit module comprising:

first and second terminals for receiving respective first and second voltages from circuitry external to the module;

a plurality of integrated circuit dice each including:
  a bond pad; and
  a function circuit coupled to the bond pad and adapted to be responsive to the first voltage by entering a first mode and to be responsive to the second voltage by entering a second mode, the second mode being different than the first mode;

a switching apparatus connected between the first terminal and each die bond pad for selectively isolating each function circuit from the first terminal and for otherwise conducting the first voltage to each function circuit; and an impedance apparatus connected between the second terminal and each die bond pad for conducting the second voltage to each function circuit when each function circuit is isolated from the first terminal and for otherwise supporting a voltage differential between the first voltage at each function circuit and the second voltage at the second terminal.

22. The integrated circuit module of claim 21 wherein the first and second terminals each comprise a Multi-Chip Module (MCM) pin.

23. The integrated circuit module of claim 21 wherein the first terminal comprises a no-connection (N/C) pin.

24. The integrated circuit module of claim 21 wherein each of the integrated circuit dice is selected from a group comprising a Dynamic Random Access Memory (DRAM) die, a Static Random Access Memory (SRAM) die, a Synchronous Graphics Random Access Memory (SGRAM) die, Read-Only-Memory (ROM) die, a flash memory die, a Rambus RAM die, a processor die, and a logic die.

25. The integrated circuit module of claim 21 wherein the first mode comprises a test mode, wherein the second mode comprises an operational mode.

26. The integrated circuit module of claim 21 wherein the switching apparatus comprises a plurality of switching circuits each coupled between the first terminal and one of the die bond pads.

27. The integrated circuit module of claim 21 wherein the switching apparatus comprises at least one switching circuit selected from a group comprising a fuse and a transistor.

28. The integrated circuit module of claim 21 wherein the impedance apparatus comprises a plurality of impedance circuits each coupled between the second terminal and one of the die bond pads.

29. The integrated circuit module of claim 21 wherein the impedance apparatus comprises an impedance circuit selected from a group comprising an anti-fuse, a MOS transistor, and a resistor.

30. An integrated circuit module substrate for attachment to an integrated circuit die having a test bond pad, the die being of the type to enter a test mode responsive to receiving a test operation signal through its test bond pad and to enter an operational mode responsive to receiving a regular operation signal through its test bond pad, the substrate comprising:

a test terminal for receiving the test operation signal from circuitry external to the substrate;

an operational terminal for receiving the regular operation signal from circuitry external to the substrate;

a switching circuit connectable between the test terminal and the test bond pad for selectively isolating the test bond pad from the test terminal and for otherwise conducting the test operation signal to the test bond pad; and an impedance circuit connectable between the operational terminal and the test bond pad for conducting the regular operation signal to the test bond pad when the test bond pad is isolated from the test terminal and for otherwise supporting a voltage differential between the test operation signal at the test bond pad and the regular operation signal at the operational terminal.

31. The integrated circuit module substrate of claim 30 wherein the test and operational terminals each comprise a Multi-Chip Module (MCM) pin.

32. The integrated circuit module substrate of claim 30 wherein the test terminal comprises a no-connection (N/C) pin.

33. An electronic system comprising an input device, an output device, a memory device, and a processor device coupled to the input, output, and memory devices, at least a portion of one or more of the input, output, memory, and processor devices being provided in an integrated circuit module comprising:

a module terminal for receiving a first voltage from circuitry external to the module;

a function circuit adapted to be responsive to the first voltage by entering a first mode and to be responsive to a second voltage by entering a second mode different than the first mode;

a die bond pad;

a switching circuit connected with the die bond pad between the module terminal and the function circuit for selectively isolating the function circuit from the module terminal and for otherwise conducting the first voltage to the function circuit; and an impedance circuit for conducting the second voltage to the function circuit when the function circuit is isolated from the module terminal and for otherwise supporting a voltage differential between the first voltage at the function circuit and the second voltage.

34. The electronic system of claim 33 wherein the input, output, memory, and processor devices together comprise a computer system.

35. The electronic system of claim 33 wherein the memory device is selected from a group comprising a Dynamic Random Access Memory (DRAM) device, a Static Random Access Memory (SRAM) device, a Synchronous Graphics Random Access Memory (SGRAM) device, a flash Read-Only-Memory (ROM) device, and a Rambus RAM device.

36. The electronic system of claim 33, further comprising a supply circuit coupled to the impedance circuit for providing the second voltage thereto.

37. The electronic system of claim 33, further comprising a voltage terminal for receiving the second voltage from circuitry external to the module, the voltage terminal being coupled to the impedance circuit for providing the second voltage thereto.

38. The electronic system of claim 33, further comprising:

a voltage terminal for receiving the second voltage from circuitry external to the module; and a voltage bond pad coupled to the voltage terminal and the impedance circuit for conducting the second voltage to the impedance circuit.

39. The electronic system of claim 33 wherein the module comprises a Multi-Chip Module (MCM).

40. The electronic system of claim 39 wherein the MCM is selected from a group comprising an In-line Memory Module (SIMM), a Random Access Memory (RAM) card, a RAM module, a Read-Only-Memory (ROM) card, and a ROM module.

41. An integrated circuit module comprising:

one or more terminals for receiving first and second voltages from circuitry external to the module;

one or more integrated circuit dice each including:

one or more function circuits each responsive to the first voltage by entering a first mode and responsive to the second voltage by entering a second mode, the first and second modes being different; and a plurality of bond pads, a first subset of which are coupled to the one or more function circuits and a second subset of which are for receiving the second voltage when the one or more function circuits are in the first mode; and a dedicated conduction circuit coupled between the one or more terminals and each die's first subset bond pads and isolated from each die's second subset bond pads for conducting the first and second voltages to each die's one or more function circuits in the respective first and second modes.

42. The integrated circuit module of claim 41 wherein the one or more terminals comprise a first terminal for receiving the first voltage and a second terminal for receiving the second voltage.

43. The integrated circuit module of claim 42 wherein the first terminal comprises a no-connection (N/C) terminal.

44. The integrated circuit module of claim 41 wherein the terminals each comprise a Multi-Chip Module (MCM) pin.

45. The integrated circuit module of claim 41 wherein the one or more terminals comprise a dedicated terminal for receiving the first and second voltages, the dedicated terminal being isolated from any other terminals on the module, wherein the dedicated conduction circuit comprises a conductor coupling the dedicated terminal to each die's first subset bond pads and isolating the dedicated terminal from each die's second subset bond pads.

46. The integrated circuit module of claim 41 wherein the one or more terminals comprise a first terminal for receiving the first voltage in the first mode and a second terminal for receiving the second voltage in the first and second modes, wherein the dedicated conduction circuit comprises:

a conductor coupling the first terminal to each die's first subset bond pads and isolating the first terminal from each die's second subset bond pads; and an impedance circuit coupling the first and second terminals for supporting a voltage differential in the first mode between the first and second voltages at the respective first and second terminals and for conducting the second voltage to each die's first subset bond pads in the second mode.

47. The integrated circuit module of claim 46 wherein the first and second terminals are positioned on opposing sides of the module, wherein the first and second terminals are coupled to one another through the impedance circuit and through a via between the opposing sides of the module.

48. The integrated circuit module of claim 41 wherein the one or more terminals comprise a first terminal for receiving the first voltage in the first mode and a second terminal for receiving the second voltage in the first and second modes, wherein the dedicated conduction circuit comprises:

a conductor coupling the first terminal to each die's first subset bond pads and isolating the first terminal from each die's second subset bond pads; and a link coupleable between the first and second terminals for conducting the second voltage to each die's first subset bond pads in the second mode.

49. The integrated circuit module of claim 48 wherein the first and second terminals are positioned on opposing sides of the module, wherein the first and second terminals are coupleable to one another through the link and through a via between the opposing sides of the module.

50. The integrated circuit module of claim 48 wherein the link is selected from a group comprising a surface mount resistor and a jumper.

51. An integrated circuit module substrate for attachment to one or more integrated circuit dice each having a plurality of test bond pads, the substrate comprising:

one or more terminals for receiving first and second voltages from circuitry external to the substrate; and a dedicated conduction circuit connectable exclusively between the one or more terminals and each die's test bond pads for conducting the first and second voltages to each die's test bond pads.

52. The integrated circuit module substrate of claim 51 wherein one of the terminals comprises a no-connection (N/C) terminal.

53. The integrated circuit module substrate of claim 51 wherein the one or more terminals comprise a dedicated terminal for receiving the first and second voltages, the dedicated terminal being isolated from any other terminals on the module substrate, wherein the dedicated conduction circuit comprises a conductor for coupling the dedicated terminal to each die's test bond pads.

54. The integrated circuit module substrate of claim 51 wherein the one or more terminals comprise a first terminal for receiving the first voltage and a second terminal for receiving the second voltage, wherein the dedicated conduction circuit comprises:

a conductor coupling the first terminal to each die's test bond pads; and an impedance circuit coupling the first and second terminals.

55. The integrated circuit module substrate of claim 54 wherein the first and second terminals are positioned on opposing sides of the module substrate, wherein the first and second terminals are coupled to one another through the impedance circuit and through a via between the opposing sides of the module substrate.

56. The integrated circuit module substrate of claim 51 wherein the one or more terminals comprise a first terminal for receiving the first voltage and a second terminal for receiving the second voltage, wherein the dedicated conduction circuit comprises:

a conductor coupling the first terminal to each die's test bond pads; and a link coupleable between the first and second terminals for conducting the second voltage to each die's test bond pads.

57. The integrated circuit module substrate of claim 56 wherein the first and second terminals are positioned on opposing sides of the module substrate, wherein the first and second terminals are coupleable to one another through the link and through a via between the opposing sides of the module substrate.

58. The integrated circuit module substrate of claim 56 wherein the link is selected from a group comprising a surface mount resistor and a jumper.

59. An electronic system comprising an input device, an output device, a memory device, and a processor device coupled to the input, output, and memory devices, at least a portion of one or more of the input, output, memory, and processor devices being provided in an integrated circuit module comprising:

one or more terminals for receiving first and second voltages from circuitry external to the module;

one or more function circuits each responsive to the first voltage by entering a first mode and responsive to the second voltage by entering a second mode, the first and second modes being different;

a plurality of die bond pads, a first subset of which are coupled to the one or more function circuits and a second subset of which are for receiving the second voltage when the one or more function circuits are in the first mode; and a dedicated conduction circuit coupled between the one or more terminals and the first subset die bond pads and isolated from the second subset die bond pads for conducting the first and second voltages to the one or more function circuits in the respective first and second modes.

60. The electronic system of claim 59 wherein one of the terminals comprises a no-connection (N/C) terminal.

61. The electronic system of claim 59 wherein the one or more terminals comprise a dedicated terminal for receiving the first and second voltages, the dedicated terminal being isolated from any other terminals on the module, wherein the dedicated conduction circuit comprises a conductor coupling the dedicated terminal to the first subset die bond pads and isolating the dedicated terminal from the second subset die bond pads.

62. The electronic system of claim 59 wherein the one or more terminals comprise a first terminal for receiving the first voltage in the first mode and a second terminal for receiving the second voltage in the first and second modes, wherein the dedicated conduction circuit comprises:

a conductor coupling the first terminal to the first subset die bond pads and isolating the first terminal from the second subset die bond pads; and an impedance circuit coupling the first and second terminals for supporting a voltage differential in the first mode between the first and second voltages at the respective first and second terminals and for conducting the second voltage to the first subset die bond pads in the second mode.

63. The electronic system of claim 62 wherein the first and second terminals are positioned on opposing sides of the module, wherein the first and second terminals are coupled to one another through the impedance circuit and through a via between the opposing sides of the module.

64. The electronic system of claim 59 wherein the one or more terminals comprise a first terminal for receiving the first voltage in the first mode and a second terminal for receiving the second voltage in the first and second modes, wherein the dedicated conduction circuit comprises:

a conductor coupling the first terminal to the first subset die bond pads and isolating the first terminal from the second subset die bond pads; and a link coupleable between the first and second terminals for conducting the second voltage to the first subset die bond pads in the second mode.

65. The electronic system of claim 64 wherein the first and second terminals are positioned on opposing sides of the module, wherein the first and second terminals are coupleable to one another through the link and through a via between the opposing sides of the module.

66. The electronic system of claim 64 wherein the link is selected from a group comprising a surface mount resistor and a jumper.

67. The electronic system of claim 59 wherein the module comprises a Multi-Chip Module (MCM).

68. The electronic system of claim 67 wherein the MCM is selected from a group comprising a Single-In-line Memory Module (SIMM), a Dual In-line Memory Module (DIMM), a Random Access Memory (RAM) card, a RAM module, a Read-Only-Memory (ROM) card, and a ROM module.

69. An integrated circuit die comprising:

a function circuit responsive to a test mode voltage by entering a test mode and responsive to an operational mode voltage by entering an operational mode;

a test mode voltage circuit for providing the test mode voltage in response to a test mode enable signal received from circuitry external to the die;

a switching circuit connected between the function circuit and the test mode voltage circuit for selectively isolating the function circuit from the test mode voltage circuit and for otherwise conducting the test mode voltage to the function circuit;

an operational mode voltage circuit for providing the operational mode voltage; and an impedance circuit connected between the function circuit and the operational mode voltage circuit for conducting the operational mode voltage to the function circuit when the function circuit is isolated from the test mode voltage and for otherwise supporting a voltage differential between the test mode voltage at the function circuit and the operational mode voltage at the operational mode voltage circuit.

70. An integrated circuit module comprising an integrated circuit die comprising:
- a function circuit responsive to a test mode voltage by entering a test mode and responsive to an operational mode voltage by entering an operational mode;
- a test mode voltage circuit for providing the test mode voltage in response to a test mode enable signal received from circuitry external to the die;
- a switching circuit connected between the function circuit and the test mode voltage circuit for selectively isolating the function circuit from the test mode voltage circuit and for otherwise conducting the test mode voltage to the function circuit;
- an operational mode voltage circuit for providing the operational mode voltage; and
- an impedance circuit connected between the function circuit and the operational mode voltage circuit for conducting the operational mode voltage to the function circuit when the function circuit is isolated from the test mode voltage and for otherwise supporting a voltage differential between the test mode voltage at the function circuit and the operational mode voltage at the operational mode voltage circuit.

71. An electronic system comprising an input device, an output device, a memory device, and a processor device coupled to the input, output, and memory devices, at least a portion of one or more of the input, output, memory, and processor devices being provided in an integrated circuit module comprising an integrated circuit die comprising:
- a function circuit responsive to a test mode voltage by entering a test mode and responsive to an operational mode voltage by entering an operational mode;
- a test mode voltage circuit for providing the test mode voltage in response to a test mode enable signal received from circuitry external to the die;
- a switching circuit connected between the function circuit and the test mode voltage circuit for selectively isolating the function circuit from the test mode voltage circuit and for otherwise conducting the test mode voltage to the function circuit;
- an operational mode voltage circuit for providing the operational mode voltage; and
- an impedance circuit connected between the function circuit and the operational mode voltage circuit for conducting the operational mode voltage to the function circuit when the function circuit is isolated from the test mode voltage and for otherwise supporting a voltage differential between the test mode voltage at the function circuit and the operational mode voltage at the operational mode voltage circuit.

72. The electronic system of claim 71 wherein the module comprises a Multi-Chip Module (MCM).

73. The electronic system of claim 72 wherein the MCM is selected from a group comprising a Single-In-line Memory Module (SIMM), a Dual In-line Memory Module (DIMM), a Random Access Memory (RAM) card, a RAM module, a Read-Only-Memory (ROM) card, and a ROM module.

74. A test apparatus for testing one or more integrated circuit dice provided in an integrated circuit module, each die having one or more bond pads adapted to receive a test mode initiate signal and being of the type to respond to the signal by entering a test mode, the module including a plurality of externally accessible terminals and being adapted to conduct the test mode initiate signal received through one of the externally accessible terminals exclusively to the bond pads adapted to receive the signal, the test apparatus comprising:
- a test-apparatus-to-module interface including a plurality of interface terminals each coupleable to one of the module's externally accessible terminals;
- a test mode enable circuit coupled to the interface for initiating the test mode in each die by providing the test mode initiate signal to the die bond pads adapted to receive the signal;
- a test signal circuit coupled to the interface for testing each die in the test mode by providing one or more test signals to each die;
- a response signal circuit coupled to the interface for receiving one or more response signals from each die in the test mode in response to the test signals; and
- an evaluator circuit coupled to the response signal circuit for evaluating the response signals from each die to identify any failing elements therein.

75. The test apparatus of claim 74 wherein each die includes a redundancy circuit coupled to the module's externally accessible terminals and responsive to repair control signals received therethrough by replacing a failing element identified by the repair control signals with a redundant element, wherein the test apparatus further comprises a repair enablement device coupled to the evaluator circuit and the interface for providing repair control signals to each die's redundancy circuit directing each die to replace any identified failing elements with redundant elements.

76. A test apparatus for testing one or more integrated circuit dice provided in an integrated circuit module, each die having one or more bond pads adapted to receive a test mode initiate signal and being of the type to respond to the signal by entering a test mode, the module including a plurality of externally accessible terminals and being adapted to conduct the test mode initiate signal received through one of the externally accessible terminals exclusively to the bond pads adapted to receive the signal, the test apparatus comprising:
- a test-apparatus-to-module interface including a plurality of interface terminals each coupleable to one of the module's externally accessible terminals;
- an input/output device coupled to the interface for receiving signals from and outputting signals to the dice; and
- a state machine coupled to the input/output device for:
    - initiating the test mode in each die by directing the input/output device to provide the test mode initiate signal to the die bond pads adapted to receive the signal;
    - testing each die in the test mode by directing the input/output device to provide one or more test signals to each die;
    - receiving one or more response signals from each die in the test mode in response to the test signals; and
    - evaluating the response signals from each die to identify the location of any failing elements therein.

77. A computer test device for testing one or more integrated circuit dice provided in an integrated circuit module, each die having one or more bond pads adapted to receive a test mode initiate signal and being of the type to respond to the signal by entering a test mode, the module including a plurality of externally accessible terminals and being adapted to conduct the test mode initiate signal received through one of the externally accessible terminals exclusively to the bond pads adapted to receive the signal, the computer test device comprising:

a test-device-to-module interface including a plurality of interface terminals each coupleable to one of the module's externally accessible terminals;

an input/output device coupled to the interface for receiving signals from and outputting signals to the dice;

a memory device; and a processor coupled to the input/output device and the memory device for:
initiating the test mode in each die by directing the input/output device to provide the test mode initiate signal to the die bond pads adapted to receive the signal;
testing each die in the test mode by directing the input/output device to provide one or more test signals to each die;
receiving one or more response signals from each die in the test mode in response to the test signals;
evaluating the response signals from each die to identify the location of any failing elements therein; and
storing the locations of failing elements in the memory device.

78. The computer test device of claim 77 wherein each die includes a redundancy circuit coupled to the module's externally accessible terminals and responsive to repair control signals received therethrough by replacing a failing element identified by the repair control signals with a redundant element, wherein the processor is further coupled to the input/output device and the memory device for providing repair control signals to each die's redundancy circuit directing each die to replace any identified failing elements with redundant elements.

79. An electronic storage medium upon which is stored a program for controlling a computer to perform in accordance with a method for testing one or more integrated circuit dice provided in an integrated circuit module, each die having one or more bond pads adapted to receive a test mode initiate signal and being of the type to respond to the signal by entering a test mode, the module including a plurality of externally accessible terminals and being adapted to conduct the test mode initiate signal from the terminals exclusively to the bond pads adapted to receive the signal, the method comprising:

providing the test mode initiate signal to one of the externally accessible terminals to initiate the test mode in the dice;

testing each die in the test mode by providing one or more test signals to each die through the externally accessible terminals;

receiving one or more response signals from each die through the terminals in the test mode in response to the test signals; and evaluating the response signals from each die to identify any failing elements therein.

80. The electronic storage medium of claim 79 wherein each die includes a redundancy circuit coupled to the module's externally accessible terminals and responsive to repair control signals received therethrough by replacing a failing element identified by the repair control signals with a redundant element, wherein the method further comprises providing repair control signals to each die's redundancy circuit through the terminals to direct each die to replace any identified failing elements with redundant elements.

81. The electronic storage medium of claim 80 wherein the method further comprises:

re-testing each die by providing one or more re-test signals to each die through the externally accessible terminals;

receiving one or more response signals from each die through the terminals in response to the re-test signals; and evaluating the response signals from each die to confirm the repair of any failing elements therein.

82. The electronic storage medium of claim 80 wherein the step of providing repair control signals to each die's redundancy circuit to direct each die to replace any identified failing elements with redundant elements comprises:

for each failing element;
determining an address associated with the failing element;
latching the failing element's address into the dice to identify the location of the failing element;
providing a programming mode enable signal to the dice to enable a programming mode therein;
enabling a redundant element in one of the dice to replace the failing element; and
programming the redundancy circuit associated with the enabled redundant element to store the failing element's address so that the stored address directs the redundancy circuit to replace the failing element with the enabled redundant element.

83. The electronic storage medium of claim 82 wherein the method further comprises limiting the redundant elements capable of being enabled to an automatically selected type of redundant element.

84. The electronic storage medium of claim 82 wherein the step of providing a programming mode enable signal comprises providing a super voltage Column Address Strobe (CAS) signal.

85. The electronic storage medium of claim 82 wherein the step of enabling a redundant element comprises:

applying a fuse address of a fusebank enable anti-fuse associated with the redundant element to the terminals to identify the location of the anti-fuse;

coupling to the anti-fuse;

determining the anti-fuse's resistance;

applying a programming voltage to the anti-fuse to blow the anti-fuse; and re-determining the anti-fuse's resistance to confirm it is blown.

86. The electronic storage medium of claim 85 wherein the step of applying the programming voltage comprises applying the programming voltage substantially in a range between 8 Volts and 10 Volts.

87. The electronic storage medium of claim 82 wherein the step of programming the redundancy circuit associated with the enabled redundant element to store the failing element's address comprises:

for each asserted address bit in the failing element's address;
applying a fuse address of an address bit anti-fuse associated with the redundant element and corresponding to the asserted address bit to the terminals to identify the location of the anti-fuse;
coupling to the anti-fuse;
determining the anti-fuse's resistance;
applying a programming voltage to the anti-fuse to blow the anti-fuse; and re-determining the anti-fuse's resistance to confirm it is blown.

88. A method for initiating a test mode and an operational mode in a function circuit in each of one or more integrated circuit dice in an integrated circuit module having a module terminal, each function circuit being of the type to enter the test and operational modes in response to receiving respective test mode initiate and operational mode initiate signals, each die including one or more bond pads adapted to receive the test mode initiate signal, the method comprising:

receiving the test mode initiate signal at the module terminal;

conducting the test mode initiate signal only to those bond pads adapted to receive the test mode initiate signal and from those bond pads to each function circuit to initiate the test mode therein;

discontinuing conduction of the test mode initiate signal to each function circuit; and conducting the operational mode initiate signal to each function circuit to initiate the operational mode therein.

89. The method of claim 88 wherein the step of conducting the test mode initiate signal comprises:

disconnectably connecting the module terminal to each function circuit through one of the bond pads adapted to receive the test mode initiate signal; and supporting a difference in voltages between the test mode initiate signal at each function circuit and the operational mode initiate signal.

90. The method of claim 89 wherein the step of discontinuing conduction of the test mode initiate signal to each function circuit comprises disconnecting each function circuit from the module terminal.

91. The method of claim 90 wherein the step of disconnecting each function circuit from the module terminal comprises programming a programmable element selected from a group comprising a fuse and an anti-fuse.

92. The method of claim 89 wherein the step of supporting a difference in voltages between the test mode initiate signal at each function circuit and the operational mode initiate signal comprises providing an impedance circuit coupled between each function circuit and the operational mode initiate signal.

93. The method of claim 88 wherein the step of conducting the operational mode initiate signal to each function circuit comprises:

providing an operational terminal in the module;

receiving the operational mode initiate signal at the operational terminal; and coupling the operational terminal to each function circuit through an element selected from a group comprising an impedance circuit and a link.

94. The method of claim 88 wherein the step of conducting the operational mode initiate signal to each function circuit comprises:

generating the operational mode initiate signal on each die; and conducting the generated operational mode initiate signal to each function circuit through an impedance circuit.

95. A method for initiating a test mode and an operational mode in a function circuit in an integrated circuit die provided in an integrated circuit module having a plurality of externally accessible terminals, the function circuit being of the type to enter the test and operational modes in response to receiving respective test mode initiate and operational mode initiate signals, the method comprising:

receiving test mode control signals on the module's terminals from circuitry external to the module;

conducting the test mode control signals to the die;

generating the test mode initiate signal on the die responsive to the test mode control signals;

disconnectably conducting the test mode initiate signal to the function circuit to initiate the test mode therein;

disconnecting the test mode initiate signal from the function circuit;

providing the operational mode initiate signal on the die;

conducting the operational mode initiate signal to the function circuit to initiate the operational mode therein.

96. The method of claim 95 wherein the step of disconnectably conducting the test mode initiate signal to the function circuit includes supporting a difference in voltages between the test mode initiate signal at the function circuit and the operational mode initiate signal.

97. The method of claim 95 wherein the step of disconnectably conducting the test mode initiate signal to the function circuit comprises coupling the test mode initiate signal to the function circuit through a switching circuit selected from a group comprising a fuse, an anti-fuse, and a transistor.

98. The method of claim 95 wherein the step of disconnecting the test mode initiate signal from the function circuit comprises programming a programmable element selected from a group comprising a fuse and an anti-fuse.

99. A method of testing one or more integrated circuit dice provided in an integrated circuit module, each die having one or more bond pads adapted to receive a test mode initiate signal and being of the type to respond to the signal by entering a test mode, the module including a plurality of externally accessible terminals, the method comprising:

providing the test mode initiate signal to one of the externally accessible terminals;

conducting the test mode initiate signal exclusively to the bond pads adapted to receive the signal to initiate the test mode in the dice;

testing each die in the test mode by providing one or more test signals to each die through the externally accessible terminals;

receiving one or more response signals from each die through the terminals in the test mode in response to the test signals; and evaluating the response signals from each die to identify any failing elements therein.

100. The method of claim 99 wherein each die includes a redundancy circuit coupled to the module's externally accessible terminals and responsive to repair control signals received therethrough by replacing a failing element identified by the repair control signals with a redundant element, wherein the method further comprises providing repair control signals to each die's redundancy circuit through the terminals to direct each die to replace any identified failing elements with redundant elements.

101. The method of claim 100, further comprising:

re-testing each die by providing one or more re-test signals to each die through the externally accessible terminals;

receiving one or more response signals from each die through the terminals in response to the re-test signals; and evaluating the response signals from each die to confirm the repair of any failing elements therein.

102. The method of claim 100 wherein the step of providing repair control signals to each die's redundancy circuit to direct each die to replace any identified failing elements with redundant elements comprises:

for each failing element;
determining an address associated with the failing element;
latching the failing element's address into the dice to identify the location of the failing element;
providing a programming mode enable signal to the dice to enable a programming mode therein;
enabling a redundant element in one of the dice to replace the failing element; and
programming the redundancy circuit associated with the enabled redundant element to store the failing element's address so that the stored address directs the redundancy circuit to replace the failing element with the enabled redundant element.

103. The method of claim 102, further comprising limiting the redundant elements capable of being enabled to an automatically selected type of redundant element.

104. The method of claim 102 wherein the step of providing a programming mode enable signal comprises providing a super voltage Column Address Strobe (CAS) signal.

105. The method of claim 102 wherein the step of enabling a redundant element comprises:

applying a fuse address of a fusebank enable anti-fuse associated with the redundant element to the terminals to identify the location of the anti-fuse;
coupling to the anti-fuse;
determining the anti-fuse's resistance;
applying a programming voltage to the anti-fuse to blow the anti-fuse; and
re-determining the anti-fuse's resistance to confirm it is blown.

106. The method of claim 105 wherein the step of applying the programming voltage comprises applying the programming voltage substantially in a range between 8 Volts and 10 Volts.

107. The method of claim 105 wherein the steps of applying a fuse address, coupling to the anti-fuse, determining the anti-fuse's resistance, applying a programming voltage, and re-determining the anti-fuse's resistance are automated.

108. The method of claim 102 wherein the step of programming the redundancy circuit associated with the enabled redundant element to store the failing element's address comprises:

for each asserted address bit in the failing element's address;
applying a fuse address of an address bit anti-fuse associated with the redundant element and corresponding to the asserted address bit to the terminals to identify the location of the anti-fuse;
coupling to the anti-fuse;
determining the anti-fuse's resistance;
applying a programming voltage to the anti-fuse to blow the anti-fuse; and
re-determining the anti-fuse's resistance to confirm it is blown.

109. The method of claim 108 wherein the steps of applying a fuse address, coupling to the anti-fuse, determining the anti-fuse's resistance, applying a programming voltage, and re-determining the anti-fuse's resistance are automated.

\* \* \* \* \*